(12) United States Patent
Wang et al.

(10) Patent No.: US 6,190,807 B1
(45) Date of Patent: Feb. 20, 2001

(54) MASK COMPATIBLE WITH DIFFERENT STEPPERS

(75) Inventors: Yuang-Cheng Wang, Hsinchu; Chii-Ming Shiah, Hsinchu Hsien, both of (TW)

(73) Assignee: United Integrated Circuits Corp., Hsinchu (TW)

( * ) Notice: Under 35 U.S.C. 154(b), the term of this patent shall be extended for 0 days.

(21) Appl. No.: 09/246,225

(22) Filed: Feb. 8, 1999

(30) Foreign Application Priority Data

Jul. 22, 1998 (TW) .................................................. 87111934

(51) Int. Cl.$^7$ ....................................................... G03F 9/00
(52) U.S. Cl. ................................................. 430/5; 430/22
(58) Field of Search ............................................. 430/5, 22

(56) References Cited

U.S. PATENT DOCUMENTS 5,948,572 * 9/1999 Lin et al. ................................ 430/22

* cited by examiner

*Primary Examiner*—Christopher G. Young
(74) *Attorney, Agent, or Firm*—J.C. Patents; Jiawei Huang

(57) ABSTRACT

A mask includes a piece of reticle glass, a chromium thin film, a pre-alignment mark, a first alignment mark, a second alignment mark, a first identification barcode, and a second identification barcode. There is also a pellicle flame formed on the chromium thin film to prevent the patterning defects caused by particles. The mask of the invention is compatible with an ASML stepper and a Nikon stepper

7 Claims, 1 Drawing Sheet

MASK COMPATIBLE WITH DIFFERENT STEPPERS

CROSS-REFERENCE TO RELATED APPLICATION

This application claims the priority benefit of Taiwan application serial no. 87111934, filed Jul. 22, 1998, the full disclosure of which is incorporated herein by reference.

BACKGROUND OF THE INVENTION

1. Field of the Invention

This invention relates to mask used in a semiconductor fabrication process, and more particularly, to a mask that is compatible with steppers of different manufacturers.

2. Description of Related Art

Photolithography is a process commonly used in patterning and implantation processes. Generally, the number of photolithography processes, the number of required masks, represents the difficulty of fabricating a semiconductor device. In addition, the development and improvement of a higher-resolution mask helps the achievement on reducing the linewidth of a semiconductor fabrication process, that is, increases the integration of a semiconductor device.

The principle of photolithography basically includes coating a photoresist layer on a wafer, and selectively exposing the photoresist layer by the light pass through a mask to transfer the pattern on the mask onto the photoresist layer.

Besides a light source, a photolithography process also required a mask having a predetermined pattern thereon. The main body of a mask is a piece of planer and transparent reticle glass. The predetermined pattern is formed on the piece of reticle glass by coating a chromium thin film thereon, wherein the thickness of the chromium thin film is about several hundred angstroms. An additional chromium dioxide thin film of about 200 Å thick is optionally coated on the chromium thin film to prevent the reflection of incident light.

Conventionally, there are three basic types of exposure process including contact, proximity, and projection. Among the foregoing exposure processes, the projection-type exposure process is advantaged on protecting the pattern on the mask, and providing a higher resolution, wherein the projection-type exposure process is normally performed by using a stepper.

Since a fabrication process sometimes has steppers of different manufacturers involved for increasing the yield, and different manufacturers use masks of different standards, so several sets of masks are required for the same processes performed on the steppers of different manufacturers. Hence, the cost of preparing masks is increased, and the fabrication flow becomes complicated as well.

SUMMARY OF THE INVENTION

It is therefore an objective of the present invention to provide a mask compatible with steppers of different manufacturers to reduce the cost of preparing the mask and simplify the fabrication flow.

In accordance with the foregoing and other objectives of the present invention, the invention provides a mask that contains several sets of alignment information on the reticle glass, so that the mask can be used on steppers of different manufacturers. Each set of alignment information on the mask according to the invention contains an alignment mark and an identification barcode. In order to prevent the defect caused by the particles on the mask, the mask according to the invention further contains a pellicle frame on the chromium layer and the chromium dioxide layer formed on a piece of reticle glass.

In order to apply the mask of the invention on the steppers from both ASML and Nikon, the invention provides a mask including a piece of reticle glass, a chromium thin film, a pre-alignnment mark, a first alignment mark, a second alignment mark, a first identification barcode, and a second identification barcode. There is also a pellicle frame formed on the chromium thin film to prevent the patterning defects caused by particles.

BRIEF DESCRIPTION OF DRAWINGS

The invention can be more filly understood by reading the following detailed description of the preferred embodiments, with reference made to the accompanying drawings, wherein.

DETAILED DESCRIPTION OF PREFERRED EMBODIMENTS

Figure 1:
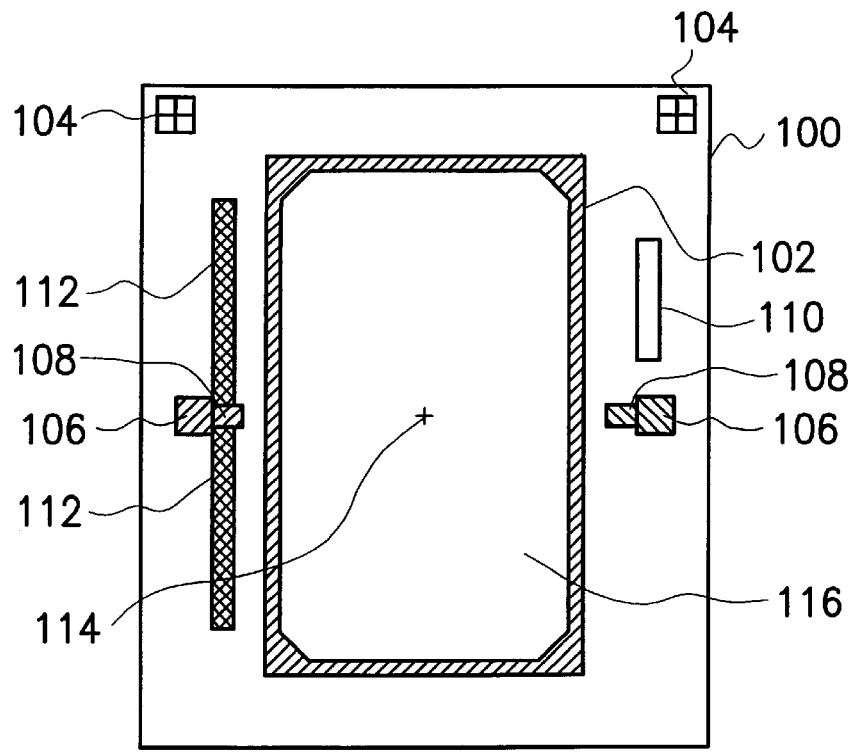
FIG. 1 is a schematic diagram showing the layout of the mask of a preferred embodiment according to the invention.

The invention provides a new mask compatible with steppers of different manufacturers, such as ASML and Nikon, so that the mask according to the invention can be used on different steppers for performing a photolithography process, as shown in FIG. 1.

Referring to FIG. 1 a piece of reticle glass 100 is partially coated with a chromium film 102. Two pre-alignment marks 104 are placed on the two top corners of the reticle glass 100 that are not covered by the chromium film 102. The two pre-alignment marks 104 are used to performing a pre-alignment process on a first stepper, such as a stepper from ASML.

On the middle portion of the reticle glass 100, there is a pair of first alignment marks 106 placed on two sides ol the reticle glass respectively. There is also a pair of second alignment marks 108 placed on two sides of the middle portion of the reticle glass respectively as well. The first alignment mark 106 is selected when the mask is placed on the first stepper. On the other hand, the second alignment mark 108 is selected if the mask is placed on a second stepper, such as a stepper from Nikon. On the mask of this embodiment according to the invention, since the positions of alignment marks for a stepper from ASML and the positions of alignment marks for a stepper from Nikon are overlapped, the second alignment marks are shrunk by 500 $\mu$m. On each side of the reticle glass 100, the first alignment mark and the second alignment mark are next to each other.

On one side of the reticle glass 100, there is a first identification barcode 110 for the first stepper from ASML. On the opposite side of the first identification barcode 110, there are two second identification barcodes 112 placed on upper side and the lower side of the alignment mark 106 for the second stepper from Nikon.

Figure 2:
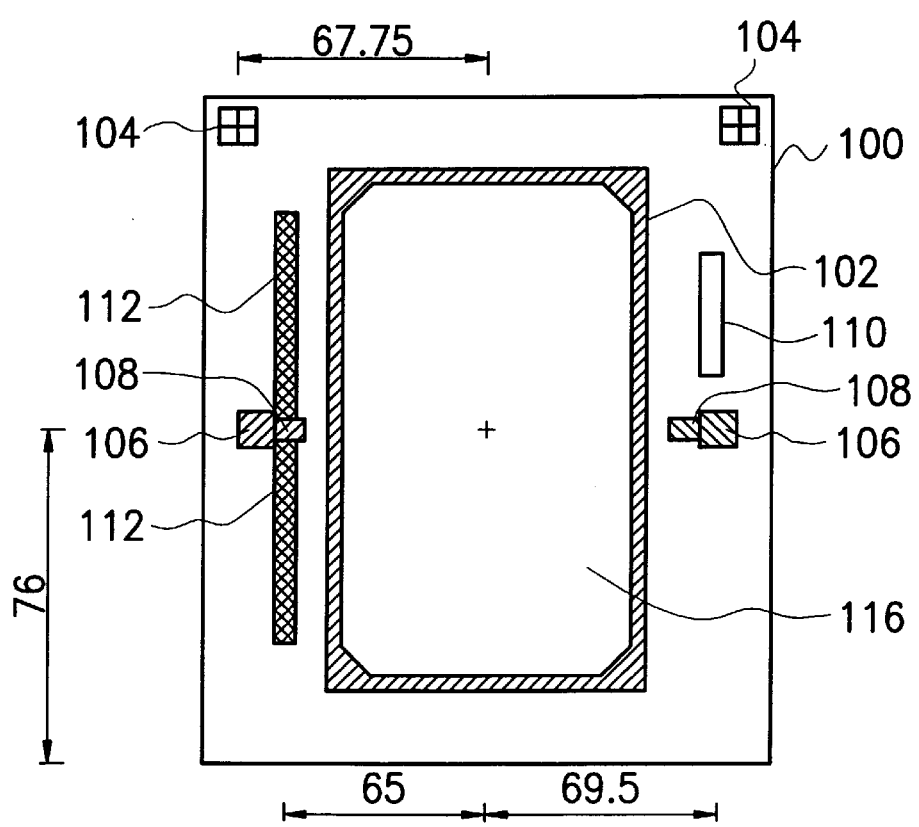
FIG. 2 is a more detailed diagram showing the layout of the mask of a preferred embodiment according to the invention.

Referring FIG. 1 together with FIG. 2, the relative locations of components of the mask according to the invention to the central point 114 of the reticle glass 100 are as following:

The pre-alignment mark 104 is 67.75 mm horizontally to the central point 114;

The distance between the upper edge of the reticle glass 100 and the central point 114 is 76 mm, as well as the distance between the lower edge of the reticle glass and the central point 114;

The horizontal distance between the first alignment mark 106 and the central point 114 is 69.5 mm; and The horizontal distance between the second identification barcode 112 and the central point 114 is 65 mm.

Besides, the central point of the pellicle frame on the chromium thin film 102 and the central point 114 of the reticle glass 100 are located at the same spot. A identification barcode used in a conventional mask for the stepper from ASML is not used on the mask of the invention to prevent the occurrence of misalignment on a Nikon stepper since its location is too close to the identification barcode 112.

Since the mask of the invention is compatible with steppers of both ASML and Nikon, the cost on preparing masks is reduced, and the fabrication flow management is simplified as well.

It is understood that people skilled in this art can easily implement the principle of the invention to form a mask, which is compatible with steppers of other manufacturers besides ASML and Nikon.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A mask compatible with a first stepper and a second stepper, wherein the first stepper is different from the second stepper, the mask comprising:

a piece of reticle glass, wherein the piece of reticle glass has a central point, a upper edge and a lower edge;

a chromium thin film formed on the central portion of the piece of reticle glass;

a pre-alignment mark for performing a pre-alignment process on the first stepper;

a first alignment mark for performing an alignment process on the first stepper;

a second alignment mark for performing an alignment process on the second stepper, wherein the second alignment mark has a dimension;

a first identification barcode for performing an alignment process on the first stepper; and a second identification barcode for performing an alignment process on the second stepper.

2. The mask of claim 1, wherein the pre-alignment mark is 67.75 mm horizontally away from the central point.

3. The mask of claim 1, wherein the upper edge of the piece of the reticle glass and the central point are 76 mm away vertically, and wherein the lower edge of the piece of the reticle glass and the central point are 76 mm away vertically.

4. The mask of claim 1, wherein the first alignment mark is 69.5 mm horizontally away from the central point.

5. The mask of claim 1, wherein the second alignment mark is 65 mm horizontally away from the central point.

6. The mask of claim 1, wherein the dimension of the second alignment mark is 500 $\mu$m less than a conventional alignment mark for the second stepper.

7. The mask of claim 1, wherein the first alignment mark and the second alignment mark are placed next to each other.

* * * * *